United States Patent [19]
Kim et al.

[11] Patent Number: 6,108,802
[45] Date of Patent: Aug. 22, 2000

[54] TESTING METHOD AND APPARATUS FOR FIRST-IN FIRST-OUT MEMORIES

[75] Inventors: Ilyoung Kim; James Louis Lewandowski, both of Plainsboro, N.J.

[73] Assignee: Lucent Technologies Inc., Murray Hill, N.J.

[21] Appl. No.: 09/048,537

[22] Filed: Mar. 25, 1998

[51] Int. Cl.[7] .................................................. G01R 31/28
[52] U.S. Cl. ............................... 714/718; 714/48; 714/42
[58] Field of Search ............................... 714/718, 48, 42; 377/29

[56] References Cited

U.S. PATENT DOCUMENTS

| | | | |
|---|---|---|---|
| 5,291,449 | 3/1994 | Dehara | 714/718 |
| 5,381,419 | 1/1995 | Zorian | 714/718 |
| 5,473,651 | 12/1995 | Guzinski et al. | 377/29 |
| 5,513,318 | 4/1996 | van de Goor et al. | 714/48 |
| 5,784,382 | 7/1998 | Byers et al. | 714/718 |
| 5,935,263 | 8/1999 | Keeth et al. | 714/718 |
| 5,978,935 | 11/1999 | Kim et al. | 714/42 |

OTHER PUBLICATIONS

Fenstermaker, et al. A Low–Power Generator–Based FIFO using Ring Pointers and Current–Mode Sensing, IEEE, 1993.
van de Goor, et al. Fault Models and Tests Specific for FIFO Functionality, IEEE, 1994.
van de Goor, et al. Functional tests for Ring–Address SRAM–type FIFOs, IEEE, 1994.
Standard Cells and Building Blocks, 1.25P$\mu$ CMOS Library, AT & T (2d. Ed. 1989), pp. 8–6 to 8–10.
CMOS/BiCMOS Data Book, Cypress Semiconductor (Mar. 1, 1992), Chapter 5, pages for devices commercially designated as CY7C432 and CY7C433.
CMOS/BiCMOS Data Book, Cypress Semiconductor (Mar. 1, 1992), Chapter 5, pages for devices commercially designated as CY7C401/CY7C403/CY7C402/CY7C404.
CMOS/BiCMOS Data Book, Cypress Semiconductor (Mar. 1, 1992), Chapter 5, pages for devices commercially designated as CY7C408A and CY7C409A.
CMOS/BiCMOS Data Book, Cypress Semiconductor (Mar. 1, 1992), Chapter 5, pages for devices commercially designated as CY7C420, CY7C421, CY7C424, CY7C425, CY7C428, CY7C429.
CMOS/BiCMOS Data Book, Cypress Semiconductor (Mar. 1, 1992), Chapter 5, pages for devices commercially designated as CY7C431 and CY7C433.
van de Goor et al., "Fault Models and Tests for Ring Address Type FIFOs."

*Primary Examiner*—Albert De Cady
*Assistant Examiner*—Guy Lamarre
*Attorney, Agent, or Firm*—Darby & Darby

[57] ABSTRACT

A variety of FIFOs, including single and dual port, RAM-type and/or having a ring-type addressing mechanism, are tested by causing the FIFOs to execute a test method comprised of a series of steps. Upon execution, the steps cause the FIFO to manifest a variety of faults. This test method manifests faults by monitoring the outcome of operations and the values of particular flags indicative of normal FIFO operation.

28 Claims, 3 Drawing Sheets

TESTING METHOD AND APPARATUS FOR FIRST-IN FIRST-OUT MEMORIES

FIELD OF THE INVENTION

This invention relates to a technique for testing first-in-first-out memories in order to detect structural and functional faults

BACKGROUND OF THE INVENTION

First-In First-Out memories (FIFOs) are used in a variety of applications. For example, they can be used in electronic circuits for buffering data transferred between a pair of circuits that operate at different clock rates, for example, ATMs, or between different processing stages. Generally, there are two types of FIFOs, a shifting (also called latch) based FIFOs and memory-based FIFOs. The shifting based FIFO is the shift register type that uses a self-clocking register for shifting data from a write port to a read port. The memory-based FIFO utilizes a Random Access Memory (RAM) as its storage element, rather than a shift register. The RAM within the RAM-type FIFO may have a single (combined) read/write port or separate (dual) ports for reading and writing data. The RAM further includes n storage rows or words, where n is an integer. One type of dual-port RAM-type FIFO uses a ring-type addressing mechanism. Register type FIFOs include either a shared read/write port or separate read and write ports. Such FIFOs also include a Write Address Register (WAR) connected to the write port and a Read Address Register (RAR) connected to the read port. The WAR and RAR operate to address the RAM. The WAR and RAR address the RAM so that words of data can be written to or read from the RAM. In addition, during normal operation of the FIFO, as a result of a read or write operation on a given memory location of the RAM, the FIFO causes the RAR or WAR to be incremented to address the next successive memory location (also called an address) in the RAM. Moreover, the input port of the RAM is connected to a Data Input Register (DIR) that acts as a buffer to temporarily store incoming data supplied on a Data Input (DI) line before such data is written to the RAM. Similarly, the output port of the RAM is connected to a Data Output Register (DOR) that stores data read from the RAM. Also, the FIFO has reset and re-transmit functions. The reset function causes both address registers to be positioned at the first memory location of the FIFO's memory. The re-transmit function causes only the read address register to be positioned at the first memory location of the FIFO's memory while not changing the write address register's position.

From a reliability standpoint, it is desirable to test all aspects of the FIFO. Fault models and algorithms have been described in the literature for detecting faults in RAMs. In addition, U.S. Pat. No. 5,513,318 (the '318 patent) to Ad J. van de Goor and Yervant Zorian, provides a technique to detect memory, addressing and functional faults that may occur in a ring-address FIFO. The disclosure of that patent is incorporated herein in its entirety by reference.

Such algorithms (including the '318 patent algorithm) detect a predetermined number and type of faults in a fault model. In addition, the comprehensiveness of each fault detected is a consideration in designing the algorithms. Comprehensiveness is exemplified by the algorithm testing for a particular fault type solely when the write and read address pointers are positioned at a single or a limited number of memory locations versus detecting such fault for a greater number of words in the FIFO memory. However, comprehensiveness impacts the length of time it takes for the algorithm to execute or run. For example, the testing time to detect a particular fault type for each of n words would be longer than such time to test it from a single or a limited number of n words. Accordingly, there is a determination of comprehensiveness and testing time built into the algorithms.

The testing time for a series of operations in an algorithm or the entire algorithm is defined in part by the number of operations per address multiplied by the total number of distinct addresses in the memory array on which the operations are executed. Therefore, the testing time can be reduced by reducing the number of operations or the number of distinct addresses on which such operations execute.

There is a need to improve the testing time for portions of algorithms (e.g., the '318 patent algorithm) which test particular operations, such as, for example, the reset, re-transmit and the memory cells. In addition, there is a need to improve the comprehensiveness of the faults detected by such algorithms.

In addition, in order for the '318 patent algorithm to detect the fault model described in that patent, it should be applied to ring-address FIFO. If it is applied to more general memory-based FIFOs, then that fault coverage (or the number of fault types detected) is reduced. For example, the '318 patent algorithm may not detect faults involving the manner in which the read and write pointers address the FIFO memory (called addressing faults). Accordingly, there is a need for a method of detecting a fault model, including at least addressing faults, for memory-based FIFOs besides ring address FIFOs.

Our invention is a method and apparatus for testing all types of memory-based FIFOs, including shift register or single or dual port RAM-type memories or ring-type addressing mechanisms, in order to detect faults, including addressing faults.

In one embodiment of our invention, the method and apparatus cause the FIFO to execute several steps of operations, including read, write, reset and re-transmit operations. In addition, during particular operations, a write enable signal, a read enable signal or a data input line for writing data to the RAM are held at constant binary values. In addition, one object of the present invention is to improve the testing time or comprehensiveness of fault detection for testing the reset, re-transmit or memory cell operations. Also, it is another object of the present invention to detect faults corresponding to a fault model, including addressing faults, for all types of memory-based FIFOs.

When executed, an initial step of operations generally checks basic operations of the FIFO and also detects faults associated with over-read protection, write acknowledge and read acknowledge, write enable, read enable and re-transmit. A first step of operations can next be executed according to the present invention.

The first step of operations, when executed, generally checks the reset operation. The testing time for this first step of operations (or amount of time for the test to complete) is proportional to n*log(n). Since the testing time for the '318 patent FIG. 3 algorithm (steps 9 to 13) is proportional to n², the testing time for the present invention is shorter than the testing time for the '318 patent algorithm for checking the reset function. This is because in the present invention, the reset operation is checked for each binary address where the address contains a single binary one value bit while the remaining bits in the address contain binary zero values. For example, the present invention checks the reset function from the addresses 000 . . . 001, 000 . . . 010, 000 . . . 100 et seq. 010 . . . 000 to 100 . . . 000. In contrast, the '318 patent algorithm checks the reset function from each of the n words in the FIFO memory. Also, the present invention method checks for over-read protection in connection with this first step of operations. Such fault may not be detected during the reset function checking in the '318 patent. Therefore, in addition to the general function of checking the reset operation, the first step of operations detects faults associated with empty-FIFO (indicated by a empty-FIFO flag), full-FIFO (indicated by a full-FIFO flag), addressing faults, write acknowledge and over-write protection.

Next, the present invention can involve the execution of a second step of operations. When executed, the second step of operations generally checks the re-transmit operations of the FIFO. The second step of operations is implemented on the same binary addresses as in the first step of operations. The '318 patent FIG. 3 algorithm (step 16) tests the re-transmit function from a single address. Therefore, the present invention checks for re-transmit faults more comprehensively than the '318 patent algorithm. In addition, the second step of operations also detects over-read protection. All such faults may not be detected during the re-transmit function checking in the '318 patent. Therefore, in addition to the general function of checking the re-transmit, the second step of operations detects faults associated with empty-FIFO, over-read protection and read acknowledge.

A third step of operations can next be executed according to the present invention. When executed, the third step of operations resets the FIFO in order to support detection of faults during subsequent steps of operations. A fourth step of operations which initializes the memory cells of the FIFO is executed next. The fourth step detects faults associated with reset and full-FIFO.

Next is a fifth step of operations, which generally checks the memory cells of the FIFO memory. The fifth step of operations involves writing binary zero values into the entire FIFO memory followed by writing a binary one value to a single memory location. Then, each memory location containing a binary zero value is read and verified and the memory location containing the binary one value is read and verified to ensure that the values have been retained. During each read operation, the data input line is maintained at a constant value opposite to the binary value of the word being read. After the read operation of the binary one value, binary zero values are written to the entire array in order to reinitiate the memory and position the WAR at the correct memory location. This is repeated for each of the n words in memory. In this way, the fifth step of operations detects faults for a given memory cell or word due to a transition in the binary value of another cell or word (called coupling faults). This includes coupling faults caused by neighboring memory cells within a single word as well as neighboring memory cells between neighboring words. The '318 patent FIG. 3 algorithm steps 14 to 22 detects solely faults caused by neighboring memory cells within a single word, and only a subset of those between neighboring words. Therefore, the present invention checks for memory cell operations more comprehensively than the '318 patent algorithm. In addition to coupling faults, the fifth set of operations detects faults associated with stuck-at-faults, full-FIFO, read disturb and transition faults.

Next, sixth and seventh steps of operations, which reset and initialize the FIFO, respectively, support detection of faults during subsequent steps of operations. The eighth step of operations is executed next. The eighth step also generally checks the memory cells of the FIFO memory and detects the same types of faults as the fifth set of faults, except that in the eighth step, faults are detected by operations (e.g., read and write) involving binary values which are the complements of the binary values used during the fifth step.

The ninth and tenth steps of operations can next be executed according to the present invention. When executed, the ninth and tenth steps of operations generally check for data retention faults in the FIFO memory cells and detect faults associated with data retention. The difference between the ninth and tenth steps is that the data retention faults are identified for a particular binary value in the ninth step while such faults are detected for the complement of such binary value in the tenth step.

BRIEF DESCRIPTION OF THE DRAWINGS

The foregoing and other features and advantages of the present invention will be more readily apparent from the following detailed description when read in conjunction with the accompanying drawings, wherein.

DESCRIPTION OF ILLUSTRATIVE EXEMPLARY EMBODIMENTS

Figure 1:
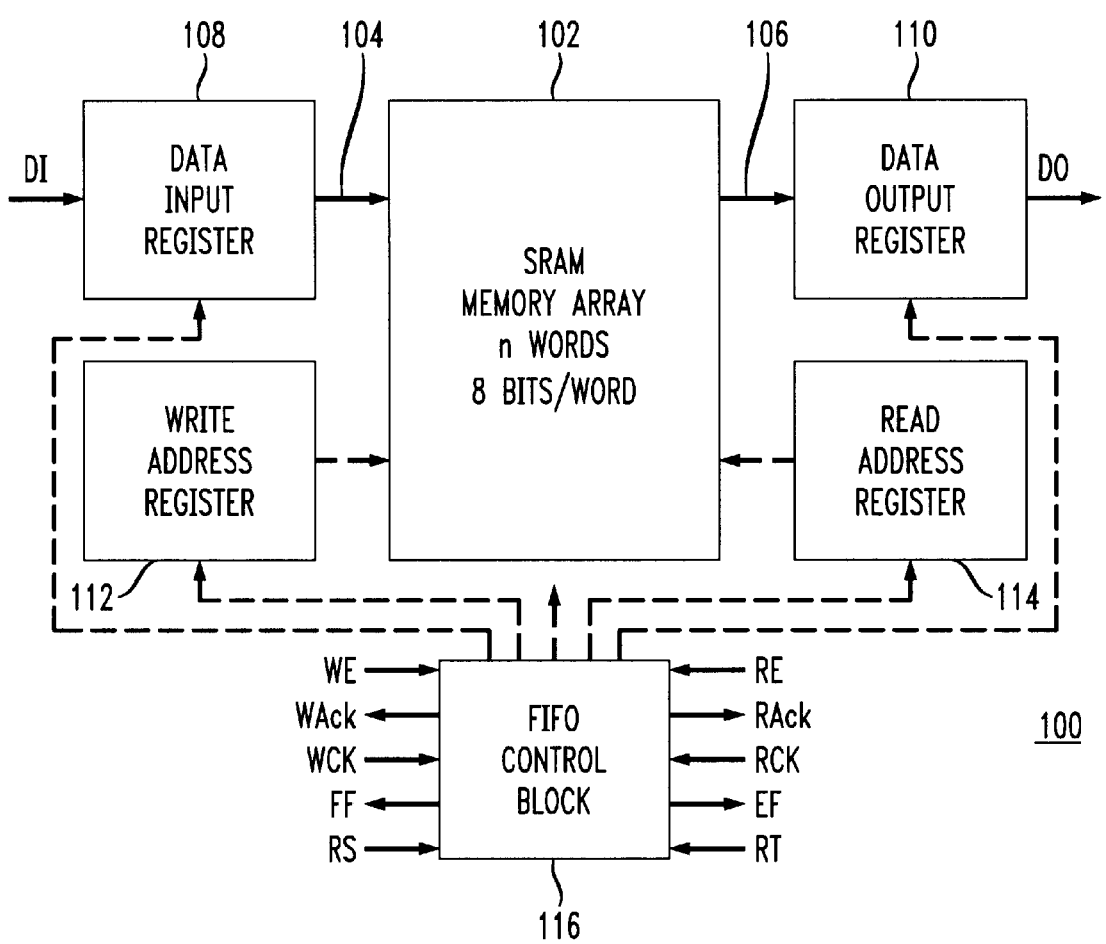
FIG. 1 is a block schematic diagram of a prior art FIFO having a dual-port RAM as its memory element, to which our present invention may be applied.
Figure 3:
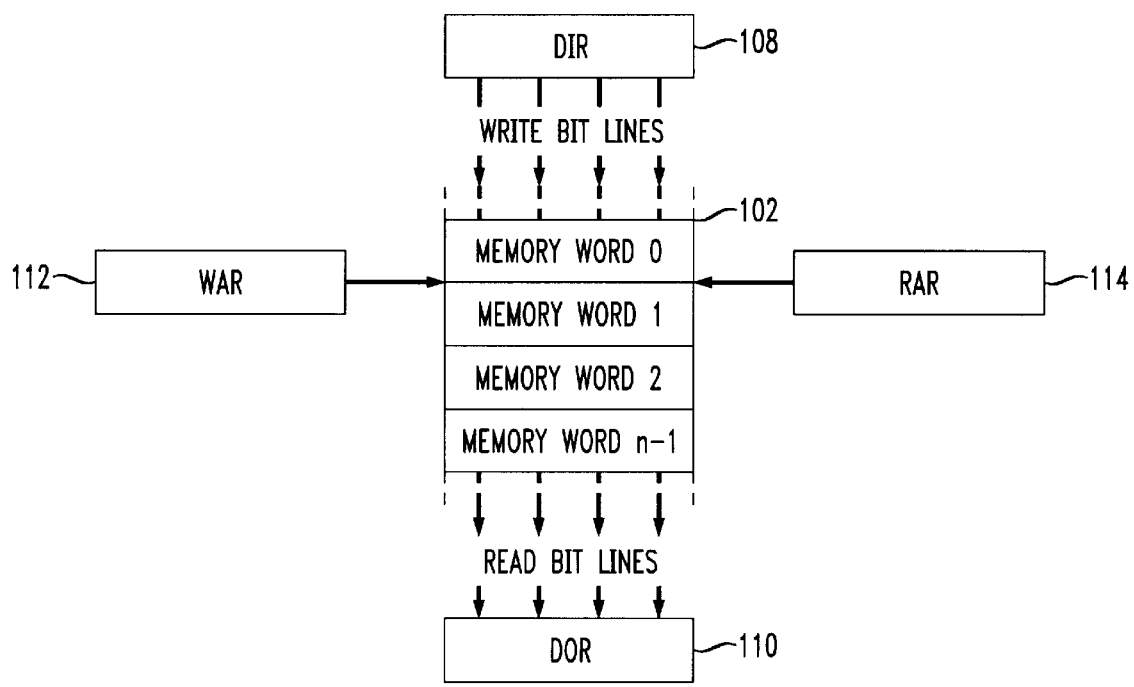
FIG. 3 is a block schematic diagram of a portion of the FIFO of FIG. 1 showing the manner in which the RAM is addressed.

FIG. 1 illustrates a dual-port RAM-type FIFO memory device 100 (hereinafter referred to as the FIFO 100) comprised of a Random Access Memory (RAM) 102 that has n storage rows or words (shown in FIG. 3). The RAM 102 has separate input and output ports 104 and 106, respectively, through which data is written to, and read from, respectively, the RAM 102. The input port 104 of the RAM 102 is connected to a Data Input Register (DIR) 108 and the output port 106 of the RAM 102 is connected to a Data Output Register (DOR) 110.

The FIFO 100 further includes a Write Address Register (WAR) 112 and a Read Address Register (RAR) 114. Each register 112 and 114 is M-bits wide, where M is an integer equal to the number of bits needed to address a RAM containing n words (i.e., mathematically expressed as the smallest integer not less than $\log_2 n$).

The FIFO 100 also includes a control block 116, typically a state machine, for controlling the operation of the FIFO 100 in response to a set of externally-supplied signals supplied to the FIFO 100. The externally supplied signals include the WE and RE signals for controlling the WAR 112, DIR 108, RAR 114 and DOR 110.

For the illustrative embodiments described herein, operation of the FIFO 100 is based on a logical scheme where a binary one value is active. An active level means that the relevant bit contains a logic high or binary one value. Similarly, an inactive level means that the relevant bit contains a logic low or binary zero value. In alternative embodiments, the logical scheme can be based on the complement binary values such that an active level is low and an inactive level is high. However, for the description of the illustrative embodiments herein, a logical scheme of an active logic high is used.

A write operation of the contents of the DIR 108 to address the RAM 102 designated by the bits in the WAR 112 occurs when both a Write Enable (WE) and a Write Clock (WCK) signal are active. A read operation of the contents of a word of the RAM 102 designated by the bits in the RAR 114 occurs when both a Read Enable (RE) signal and a Read Clock (RCK) signal are active. The contents of the RAM 102 at such address can then be applied to the DOR 110.

During normal operation of the FIFO 100 described above, when a read or write operation has been executed on a memory location, the FIFO 100 causes the read or write pointers, respectively, to be incremented to the next successive memory location in the RAM 102. This occurs at each address of the RAM 102. For example, when a read operation occurs on the last memory location of the RAM 102, the read pointer will then be positioned at the first memory location 0. Thereafter, a read operation can occur only when there is an unread word at such memory location 0. Thereafter, generally, a write operation can occur only when the word pointed to by the WAR 112 has never been written to or has been read. Once again, this occurs at each address of the RAM 102. For example, this applies when the write pointer is moved from the memory location (n−1) to the memory location 0. For further information about the operation of FIFOs, see the following references, which are incorporated herein by reference in their entireties: *Standard Cells and Building Blocks*, 1.25 μCMOS Library, AT&T (2d. Ed. 1989), pages 8–6 to 8–10 and CMOS/BiCMOS *Data Book*, Cypress Semiconductor (Mar. 1, 1992), Chapter 5, pages for devices commercially designated as CY7C432 and CY7C433.

The control block 116 is also responsive to Reset (RS) and Re-Transmit (RT) signals externally supplied to the FIFO 100. Upon receipt of the RS signal, the control block 116 resets the WAR 112 and RAR 114 so both address registers are positioned at the memory location 0 or the first word of the RAM 102. Upon receipt of the RT signal, the control block 116 resets the RAR 114 so that the RAR 114 now addresses the memory location 0 of the RAM 102 and does not reset the WAR 112.

The control block 116 not only controls the operation of the FIFO 100 but also generates certain signals (flags) indicative of the operation of the FIFO 100. One purpose of the flags is to verify that writes to a full RAM 102 or reads from an empty RAM 102 are avoided. For example, the FIFO 100 generates a Full FIFO (FF) flag and an Empty FIFO (EF) flag. The FF flag is set to a binary one value when the RAM 102 is full (i.e., each of the n words of the RAM 102 has been written but none of them has been read). Conversely, the FF flag is set to a binary zero value when the FIFO 100 is not full (i.e., one or more of the n words in the RAM 102 has not been written to or has been written to and read). The EF flag is set to a binary one value when the RAM 102 is empty (i.e., contains zero unread words). The EF flag is set to a binary zero value when the RAM 102 is not empty (i.e., one or more of the n words has been written to and not read).

Typically, the control block 116 utilizes the status of the FF and EF flags to afford the FIFO 100 Over-Write Protection (OWP) and Over-Read Protection (ORP). When the FF flag is at a logic high, then the control block 116 prevents the occurrence of a write operation (by application of the OWP) while allowing such an operation when FF equals zero. In a similar fashion, the control block 116 prevents the occurrence of a read operation (by application of the ORP) when the EF flag is at a logic high while permitting a read operation when EF equals zero. In addition to the FF and EF flags, the control block 116 generates a Write Acknowledge (WAck) signal and a Read Acknowledge (RAck) signal when a write operation and read operation, respectively, have successfully occurred. Accordingly, the OWP and ORP are used to prevent read or write operations when such operations are attempted on an address which does not contain data to be read or which already contains an unread word, respectively. This applies, for example, when the read or write pointers are incremented, for example, from the memory location (n−1) to the memory location 0 and a read or write operation is executed. Depending on the contents of such location 0, the OWP and ORP will allow or prevent the operation. Then, the WAck and RAck signals indicate whether such operation has occurred.

Figure 2:
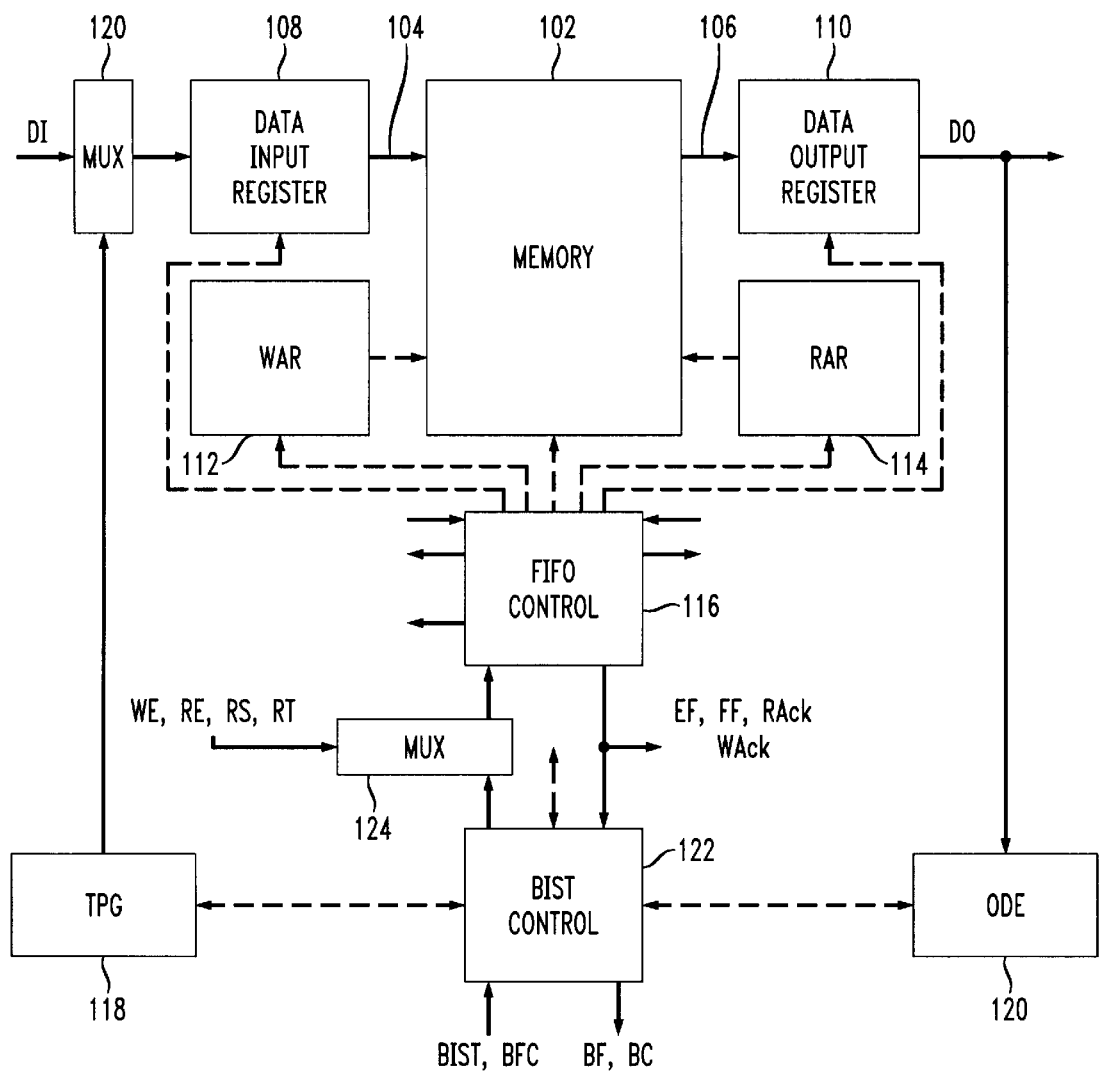
FIG. 2 is a block schematic diagram of a FIFO having a dual-port RAM as its memory element and Built-In Self-Test (BIST) features to which our present invention may be applied.

Referring to FIG. 2, in addition to the components described as to FIG. 1, the FIFO 100 also can include elements especially designed for built-in self-testability in accordance with our invention, including designing the FIFO 100 with BIST capability. The components of FIG. 2 which are the same as FIG. 1 will not be further described since they perform the same functions in the same manner as those for the FIFO 100 of FIG. 1.

The BIST capability is provided by a BIST control 122. The BIST control 122 controls a Test Pattern Generator (TPG) 118 and a Output Data Evaluator (ODE) 120. The TPG 118 generates test patterns, in the form of vectors, for input to the RAM 102. The test patterns from the TPG 118 are multiplexed by a multiplexer 121 with signals appearing on the Data Input (DI) line. The multiplexer 121 acts as a selector between the TPG 118 and the DI line. The function of the multiplexer 121 depends on whether the FIFO 100 is being tested. More particularly, during testing intervals, the multiplexer 121 passes test patterns from the TPG 118 to the DIR 108 for input to the RAM 102. During non-testing intervals, the multiplexer 121 passes signals received on the DI line to the RAM 102.

The ODE 120 is coupled to the output of the DOR 110 so as to receive the same data that is output to the Data Output (DO) line. The ODE 120 acts to compact or otherwise optimize the data output from the DO line during test intervals based on responses generated by the RAM 102 to the test patterns provided by the TPG 118. As a result, the optimized bit stream output from the ODE 120 is configured to be readily usable by a local or remote device, for example, a microprocessor chip which monitors the FIFO 100. In practice, the ODE 120 can take the form of a finite state machine. The output data compacted by the ODE 120 during test intervals takes the form of responses generated by the RAM 102 to the test patterns provided by the TPG 118.

The BIST control 122, which provides overall control of the TPG 118 and the ODE 120, as well as control of the FIFO control block 116, typically comprises a finite state machine (not shown). The control signals from the BIST control 122 are multiplexed by the multiplexer 124 with the WE, RE, RS and RT signals externally supplied to the control block 116, as described previously.

The ODE 120 is responsive to the EF and FF flags and the RAck and WAck signals generated by the control block 116. In accordance with the DO line signal and the EF and FF flags and the RAck and WAck signals, the ODE 120 operates to generate a BISTFlag (BF) signal. In addition, the BIST control 122 operates to generate a BIST Complete (BC) signal. The BF and BC flags may be accessed by an external test device (not shown) such as an external computer or test set, to determine the operating status of the FIFO 100.

The FIFO 100 may experience a variety of faults. For instance, the RAM-type FIFO 100 may experience memory faults and functional faults associated with the RAM 102. They may include:

1. Stuck-At Faults (SAF) are characterized by the presence of a logic or binary one or zero in a memory location in the RAM 102 notwithstanding the fact that a different bit value had previously been written to that location. In addition, a SAF cell is always at a particular bit value and cannot be changed. Stuck-At Faults also apply to sets of cells, for example, words in the RAM 102.

2. Transition Faults (TF) are characterized by the failure of the value of a bit stored in the RAM 102 to transition from a logic one to zero (or vice versa) following a pair of write operations during which a logic one and zero, respectively, (or a logic zero and one, respectively) were written. Transition Faults also apply to sets of cells, for example, words in the RAM 102.

3. Coupling faults (CF) are characterized by inversion, idempotent and state coupling, respectively, of a bit stored in the RAM 102. The inversion and idempotent coupling faults involve two cells or two sets of cells, where a transition occurs (as described for TFs, which is a change in the bit value of a cell or set of cells from zero to one or one to zero). For example, a write operation is performed on a first cell or set and impacts a second cell or set. For an inversion coupling fault, the effect is that the contents of the second cell are inverted. As to an idempotent coupling fault, the contents of the second cell are forced to a certain value, either zero or one. The state coupling faults apply to either the second cell or the second set of cells and are caused by a particular binary value rather than a transition write operation. More particularly, state coupling faults occur when a second cell or set of cells is forced to a certain value (e.g. a zero or a pattern of zeros) only if the first cell or first set of cells is in a given state (e.g. a zero or a pattern of zeros).

4. Read Disturb faults (RDist) are characterized by faults associated with reading a binary value from the RAM 102 while holding the DI line at the complementary binary value. This ensures that the data read is from the RAM 102.

5. Read/Write Logic Faults or Functional Faults (read operation, write operation, OWP, ORP, Rack, Wack) are characterized by faults associated with read and write operations. More particularly, the FIFO 100 may also experience functional faults as a result of an inability to perform one or more of its above-described functions and/or an inability to generate proper values for the FF and EF flags and the WAck and RAck signals. For example, EF and FF flag faults are manifested when the binary values of such flags are inaccurate based on the contents of the RAM 102. In addition, WAck and RAck signal faults are manifested when the signals indicate that a write or read operation occurred when such operation did not occur or when they indicate that such operation did not occur when it did. The FIFO 100 is also deemed to be faulty if the FIFO 100 is able to perform a write operation or read operation when the FIFO is full or empty, respectively, manifested by OWP and ORP faults.

6. Reset Faults (RS) are characterized by faults associated with the reset function.

7. Re-transmit Faults (RT) are characterized by faults associated with the re-transmit function.

8. Data Retention Faults (DRF) are characterized by the loss of a data value stored in memory in the RAM 102 over time.

9. In addition to the above-described faults, the FIFO 100 may also experience a fault in addressing the words stored in the RAM 102. Such faults, hereinafter referred to as Addressing Faults (ADF) are characterized by errors in the RAR 112 and the WAR 114 operation of addressing words in the RAM 102.

Referring to Appendix A, there is shown a table illustrating the steps of a method in accordance with a first embodiment of the invention, for testing the FIFOs of FIGS. 1 and 2. This illustrative embodiment is applied to the FIFO 100 of FIG. 1. However, the technique of the present invention is also applicable to FIFOs generally, including single or dual port RAM-type memories or ring-type addressing mechanisms. Accordingly, application of the Appendix A illustrative embodiment to the FIG. 1 FIFO 100 is merely exemplary and does not limit the present invention.

Generally, Appendix A shows an algorithm including an initial (or 0th) step through a tenth (or 10th) step of operations. Initial, first and/or second steps according to the present invention can be executed. An initial step of operations generally checks basic operations of the FIFO and also detects faults associated with ORP, WAck and RAck, WE, RE and RT. The first step of operations generally checks the reset operation and also detects faults associated with EF, FF, ADF, WAck and OWP. In addition, the second step of operations generally checks the re-transmit operations of the FIFO and also detects faults associated with EF, ORP and RAck.

A third step through an eighth step of operations can next be executed according to the present invention. The third step of operations resets the FIFO in order to support the detection of faults during subsequent steps of operations. A fourth step of operations, which initializes the memory cells of the FIFO, is executed next. The fourth step detects faults associated with RS and FF. Next is a fifth step of operations, which generally checks the memory cells of the FIFO memory and also detects faults associated with SAF, FF, RDist, CF and TF. Next, sixth and seventh steps of operations which reset and initialize the FIFO, respectively, support detection of faults during subsequent steps of operations. The eighth step of operations is executed next. The eighth step also generally checks the memory cells of the FIFO memory and detects the same types of faults as the fifth set of faults, except that in the eighth step, faults are detected by operations (e.g., read and write) involving binary values which are the complements of the binary values used during the fifth step.

The ninth and tenth steps of operations can next be executed according to the present invention. The ninth and tenth steps of operations, when executed, generally check for DRFs in the FIFO memory cells. The difference between the ninth and tenth steps is that the DRFs are identified for a particular binary value in the ninth step while such faults are detected for the complement of such binary value in the tenth step.

More particularly, the method according to the present invention comprises eleven steps, labeled steps "0" to "10". In addition, for steps (1, 2, 5 and 8), three versions of such steps are shown. More particularly, steps (1, 2, 5 and 8) include a generic form, labeled the ith step (or 1.i, 2.i, 5.i and 8.i), where i is an integer. Such ith steps are repeated, for steps 1 and 2), for the values of i from 1 to (M−2) and, for steps (5 and 8), for the values of i from 1 to (n−2). In addition to illustrating the ith or generic step, for such steps (1, 2, 5 and 8), the boundary condition steps, namely the 0th and the (M−1)th or (n−1)th steps are shown. That is, for such steps (1, 2, 5 and 8), the following steps are shown: first for i equal to 0 (for example, step (1.0)); second for i ranging from 1 to (M−2) for steps (1.i and 2.i) and from 1 to (n−2) for steps (5.i and 8.i); and third for i equal to (M−1) for steps (1 and 2) and (n−1) for steps (5 and 8). Also, steps (0 to 2, 5 and 8 to 10) include sub-steps, labeled "a" et seq, each of which contains operations.

In addition to the step information (contained in column 1 of Appendix A) the following information is illustrated: an operation to be performed or an ↑ shown in column 2 as "Oper.", which indicates that the operation is to be repeated a predetermined number of times for successive memory locations in the RAM 102. In column 4 of Appendix A, there may be a second operation (shown as "Oper."), which contains an operation for each row shown in Appendix A where an ↑ appears in the Operation column 2. Column 3 of Appendix A contains the count for the addresses in the RAM 102 on which the operation(s) of columns 2 and 4 are performed. The count begins at the value shown in the sub-column "From" and ends at the value shown or calculated from the algorithm shown in the sub-column "To". The Count column values are not representative of absolute addresses in the RAM 102, but rather are relative to the addresses or memory locations which the WAR 112 and RAR 114 point to upon the initiation of the operation to which the count applies.

Columns 5 and 6 of Appendix A illustrate the binary values of the FF and EF flags, respectively, as indicated by the "FF" and "EF" labels. In addition, the binary values shown in columns 5 and 6 are the result of the completion of the operation(s) shown in the row in which they appear. For example, where a step or sub-step includes one operation, e.g., RS, the values for the FF and EF flags are the result of the RS operation. As another example, where a step or sub-step includes successive operations, as indicated by the ↑, the values of the FF and EF flags are the result of the last execution of the series of operations. In addition, the values shown for the EF and FF flags in columns 5 and 6 should result when the FIFO 100 is operating properly. When it is not, the EF and FF flags as well as the values of other signals (such as OWP, ORP, WAck and RAck) may contain incorrect values. Column 7 of Appendix A provides a list of faults detected for a particular step or sub-step when the FIFO 100 is not operating normally. Column 7 is labeled "Detected Faults." Step (0) of Appendix A checks the basic operations of the FIFO 100 of FIG. 1, as indicated by the label "Check Basic Operations" in the row preceding such step (0). Step (0) is commenced by executing step (0.a), whereupon a RS operation is initiated to reset the FIFO 100 so that the WAR 112 and the RAR 114 each address the memory location 0, thereby addressing the first word in the RAM 102. In addition, the RS operation also causes the FF and EF flags to be set to a logic low and a logic high, respectively.

Next, step (0.b) of Appendix A is executed, during which an active (i.e., a binary one or logic high level) RE signal is supplied to the control block 116 to enable the RAM 102 to commence a read operation of reading and verifying a zero (hereinafter referred to as a r0 operation and shown as r0 in Appendix A) on the word at the memory location 0. If the FIFO 100 is operating properly, then the r0 operation should fail because no data has been written to such location. Therefore, the ORP feature of the FIFO 100 should prevent the r0 operation. In addition, the RAck flag should be inactive if the FIFO 100 is functioning properly. If the RAck signal is active, then a fault exists because the r0 operation should fail. This step (0.b) can detect ORP and RAck faults.

Step (0.c) is executed after step (0.b), whereupon an inactive (i.e., a binary zero or logic low level) WE signal is supplied to the control block 116 and a write operation is commenced to write a word of all zeros (hereinafter referred to as a w0 operation and shown as w0 in Appendix A) in the RAM 102 memory location 0. The RAM 102, unless faulty, should not commence a w0 operation while the WE signal is inactive. Therefore, the WAck signal should be inactive at this time. Thus, during step (0.c), faults associated with the WAck and WE signals can be detected.

After step (0.c), step (0.d) is executed, whereupon a w0 is commenced on the RAM 102 memory location 0. The w0 operation is commenced upon the assertion of an active WCK signal and an active WE signal. For the Appendix A illustration, where write or read operations are shown without showing the write or read enable signals, respectively, such write or read enable signals and WCK and RCK signals can be assumed to be active. Upon execution of the w0 operation, the WAck signal should be active to indicate that a w0 operation did indeed occur. Moreover, the EF flag should be inactive because the FIFO 100 should no longer be empty if the w0 operation was executed successfully. This step (0.d) can detect WAck faults.

After step (0.d), step (0.e) is executed, whereupon an inactive RE signal is supplied to the control block 116. While the RE signal is inactive, the control block 116 should not initiate a r0 operation unless there is a fault. Thus, the RAck signal should be inactive at this time. Accordingly, the RE and RAck faults can be detected during this step (0.e).

Following step (0.e), step (0.f) is executed, during which a r0 operation is executed to determine if a word of all zeros has been written to the RAM 102 memory location 0 during the previous w0 operation. The r0 operation during step (0.f) is commenced by asserting active RCK and RE signals (since, as describe above, where not shown, such signals can be assumed to be active). If the r0 operation has been successfully executed during step (0.f), the RAck signal should be active and the EF flag also should be active because the FIFO 100 should now be empty (i.e., all of the words previously written in the RAM 102 have now been read). Therefore, the RAck signal should be active as a result of this step (0.f).

Testing of the RT operations is commenced upon the execution of step (0.g), whereupon the control block 116 causes the FIFO 100 to commence a RT operation. The RT operation resets the RAR 114 to address the memory location 0 in the RAM 102. Previously, this word had been read during step (0.f) so that the EF flag is now set to a logic high level, signifying that all of the words previously written in the FIFO 100 have now been read. However, once the RT operation is commenced during step (0.g), the RAR 114 once again addresses the first word in the FIFO 100 and negates the r0 operation executed in step (0.0.f). As a consequence, the EF flag is changed to zero.

Step (1), including steps (1.0, 1.i and 1.(M−1)), tests the ability of the control block 116 to reset the WAR 112 and the RAR 114 from particular addresses designated by the WAR 112, as indicated by the label "Check Reset Operations". More particularly, in sub-step (c) of step 1, RS operations are executed M times such that for each repetition, a sequentially increasing one of the WAR 112 M-bits contains a binary one value while the remaining M-bits contain binary zero values. In order to implement this scheme, step (1) is performed M times or for each value of i from 0 to (M−1). Accordingly, step (1.i) is the generic step and Appendix A shows step (1) for the value of i equal to 0 (step (1.0)), the generic ith step (step 1.i) and for the value of i equal to (M−1) (step (M−1)). In addition, since the boundary values of i equal to 0 and (M−1) are implemented as separate steps in Appendix A, step (1.i) in the embodiment illustrated in Appendix A is executed for the values of i of 1 to (M−2).

Step (1.0) is commenced by executing step (1.0.a), whereupon a RS operation is initiated to reset the FIFO 100 so that the WAR 112 and the RAR 114 each address the memory location 0. This step (1.0.a) is the same as step (0.a). Next, step (1.0.b) of Appendix A is executed, during which a sequential series of operations for a count from 0 to 0 is executed, as illustrated by the ↑. For step (1.0.b), there is a single pair of operations, consisting of a w0 operation followed by a r0 operation. The count is relative to the positions of read and write pointers upon initiation of step (1.0.b) or upon completion of the RS operation of step (1.0.a). Step (1.0.a) resulted in such pointers pointing to the memory location 0. Therefore, the step (1.0.b) w0 and r0 operations are executed on the same memory location 0. In addition, since the data value at the memory location 0 is written to and then read from the FIFO 100, the FF and the EF flags are therefore unchanged as a result of step (1.0.b).

Step (1.0.c) follows step (1.0.b). During step (1.0.c), the control block 116 causes the FIFO 100 to commence a RS operation. Following step (1.0.c), another sequential series of operations is executed, as indicated by the ↑ in step (1.0.d). The series of operations are w0 operations performed on the relative address count of 0 to (n−2), as illustrated by the values in the Count column and the w0 operation in the Operation column 4. Since step (1.0.c) implemented a RS operation, the first of that series of w0 operations in step (1.0.d) is executed on the RAM 102 memory location 0. Step (1.0.d) is then repeated for each address from the next address to the address equal to (n−2). Since w0 operations are executed in step (1.0.d) without any r0 operations, the EF flag should be inactive as a result.

Step (1.0.e) follows step (1.0.d), whereupon a w0 operation is executed on the memory location to which the WAR 112 points to upon the initiation of this step (1.0.e) or the completion of step (1.0.d), namely the memory location (n−1). For the exemplary embodiment of the FIFO 100, the RAM 102 contains n words. Therefore, as a result of step (1.0.e), the last memory location (n−1) is written to. Therefore, the FF flag will become active and the EF flag will be unchanged. This step (1.0.e) detects RS, FF flag and ADF faults.

Following step (1.0.e), step (1.0.f) contains a w0 operation performed on the memory location to which the WAR 112 points upon the initiation of this step 1.0.f) or as a result of step (1.0.e), namely the memory location 0. This step (1.0.f) should fail because step (1.0.d) already executed a write operation on the memory location 0. Since it was not read prior to this step (1.0.f), if the FIFO 100 is operating properly, a w0 operation should fail. Accordingly, the FF and the EF flags remain active and inactive, respectively. Step (1.0.f) can detect the following faults: RS, OWP, WAck and ADF.

Step (1.i) is the generic equivalent to step (1.0) where, in step (1.0), i equals 0. Step (1.i) is repeated a number of times equal to (M−2). That is, step (1.i) is repeated for the integer values of i from 1 to (M−2) because the boundary conditions of i equal to 0 and i equal to (M−1) are shown as separate steps. However, step (1.i) will be implemented only where the value of (M−2) is greater than 1. For example, where the FIFO 100 contains sixteen words, such that the value of n is 16, the value of M is $\log_2$ of 16 or 4. For such FIFO 100, step (1.i) would be repeated two times, for the values of i equal to 1 and (M−2) or 2.

In addition, the sub-steps (1.i.a to 1.i.f) are the same as the sub-steps for step (1.0.a to 1.0.f), for the value i equal to 0. For example, for the value of i equal to 0, the equation ($2^i$−1) in the Count To column for step (1.i.b) equals 0, as shown for step (1.0.b). In addition, the same values for the FF and EF flags and the faults identified in step (1.0) apply to the generic step (1.i).

The upper boundary condition for the generic step (1.i), namely for i equal to (M−1), is executed next. Step (1.(M−1)) is the same as step (1.i) for the value of i of (M−1). Once again, the sub-steps (1.(M−1).a to 1.(M−1).f), the FF and EF flags resulting from such sub-steps and the faults detected by such sub-steps are the same as for the sub-steps of (1.0.a to 1.0.f).

Step (2), including steps (2.0, 2.i and 2.(M−1) checks the RT function, as indicated by the Appendix A label "Check Re-Transmit Operation" in the row preceding step (2.0). Step (2) is similar to step (1) in that the same addresses designated by the WAR 112 are tested, using the same values of i, n and M. In addition, step (2) is shown for the lower boundary condition for the value of i equal to 0 (step (2.0)), the generic ith step (step 2.i) and the upper boundary condition for the value of i equal to (M−1) (step (2.(M−1)).

More particularly, steps (2.0, 2.i and 2.(M−1)) are as follows: Step (2.0) is commenced by executing step (2.0.a), whereupon a RS operation is initiated to reset the FIFO 100 so that the WAR 112 and the RAR 114 each address the memory location 0. This step (2.0.a) is the same as step (0.a).

Next, step (2.0.b) is executed, during which a sequential series of operations for a count from 0 to 0 are executed, as indicated by the ↑ and the values in the Count column. Step (2.0.b) is a single pair of operations consisting of a w0 operation followed by a r0 operation, as illustrated by the w0 operation and r0 operation in Operation column 4. The count is relative to the positions of read and write pointers upon initiation of step (2.0.b) or upon completion of the RS operation of step (2.0.a). Step (2.0.a) resulted in such pointers pointing to the memory location 0. Therefore, the step (2.0.b) w0 and r0 operations are executed on the same memory location 0. Since the data value at the FIFO 100 memory location 0 is written to and then read from, the FF and EF flags are therefore unchanged as a result of this step (2.0.b).

Step (2.0.c) follows step (2.0.b). During step (2.0.c), the control block 116 causes the FIFO 100 to commence a RT operation. As described above, the RT operation resets the address pointer of the RAR 114 to the RAM 102 memory location 0. Since the RAR 114 read pointer is repositioned at the memory location 0, the control block 116 negates the r0 operation executed in step (2.0.b). Therefore, the EF flag should be inactive. The step (2.0.c) can thereby detect EF flag faults. In addition, step (2.0.c) can detect RT faults.

Following step (2.0.c), another sequential series of operations are indicated by the ↑ in step (2.0.d). They are single r0 operations performed for a count from 0 to 0, as illustrated by the ↑, the values in Count column and the r0 operation in the Operation column 4. Since the count values are relative to the location of RAR 114 read pointer and the RT operation of step (2.0.c) resulted in such pointer being positioned at the memory location 0, the r0 operation is executed on the same memory location 0. In addition, since the memory location 0 data is read in this step (2.0.d), the EF flag is changed to active. The step (2.0.d) can detect RT faults.

Step (2.0.e) follows step (2.0.d), whereupon a r0 operation is executed on the memory address to which the RAR 112 points upon initiation of this step (2.0.e) or the completion of step (2.0.d). As a result of step (2.0.d), the RAR 114 pointer is at the memory location 1. Therefore, since no data is present in that memory address, the r0 operation should be unsuccessful. In addition, the FF and EF flags should remain unchanged. Detection of the following faults can be accomplished during this step (2.0.e): RT, ORP and RAck.

Step (2.i) is the generic equivalent of step (2.0) where, in step (2.0), i equals 0. Step (2.i) is repeated (M−2) times for the values of i equal to 1 to (M−2). However, like step (1.i), step (2.i) will be implemented only where the value of (M−2) is greater than 1. The same example for implementing step (1.i) applies to implementing step (2.i).

In addition the sub-steps (2.i.a and 2.i.e) are the generic equivalent of the sub-steps (2.0.a to 2.0.e) where, in step (2.0) the values of the Count To column in sub-steps (2.0.b and 2.0.d) are $(2^i-1)$. Where i equals 0, as in step (2.0), this equation equals 0. Moreover, the same values for the FF and EF flags and the faults identified in step (2.0) apply to the generic step (2.i).

The upper boundary condition for the generic step (2.i), for i equal to (M−1), is executed next. Step (2.(M−1)) is the same as step (2.i), where the value of i in step (2.(M−1)) is (M−1). Moreover the same values for the FF and EF flags and the faults identified in step (2.0) apply to step (2.(M−1)).

Following step (2) is step (3). During step (3), a RS operation is initiated to reset the FIFO 100 so that the WAR 112 and the RAR 114 each point to the memory location 0, as indicated by the label "ReSet" in the row preceding step (3). This step (3) is the same as step (0.a).

Step (4) follows step (3). During step (4), a w0 operation is executed n times to write to each successive memory location 0 to (M−1) in the RAM 102. This is illustrated by the ↑ in the Operation column 2, the values in the Counts column and the w0 operation in the Operation column 4. Step (4) initializes the data in each memory address of the RAM 102 to zeros. Having now written the RAM 102 with data, the FF flag should be set to a binary one value and the EF flag should be set to a binary zero value. This is because the RAM 102 is full. Step (4) can detect RS and FF flag faults.

Step (5), including steps (5.0, 5.i and 5.(M−1)), test the memory faults of the RAM 102, as illustrated by the label "Check Memory Cells" in the row preceding step (5.0). Step (5) is executed n times, including step (5.0) for the value of i equal to 0, step (5.i) for the values of i equal to 1 to (n−2) and step (5.(n−1)) for the value of i equal to (n−1). Accordingly, the generic step (5.i) for the Appendix A embodiment is executed for the values of i of 1 to (n−2).

Step (5.0) is commenced by executing step (5.0.a), whereupon a read operation is initiated while the DI is held at a binary one value, as illustrated by the r0∥DI=1 in the Operation column 2. The r0 operation is performed on the memory location 0 because upon initiation of this step (5.0.b), the RAR 114 pointer remains at the memory location 0 based on the step (3) RS operation since no r0 operation was performed in step (4). This step (5.0.a) tests for faults in the data stored in such memory location 0. From step (4), the content of the memory location 0 is zeros. However, the DI is held at a binary one value. Accordingly, the r0 operation should result in zeros appearing at the DOR 110. Further, where there is a fault, a data value of 1 may appear at the DOR 110. This step (5.0.a) can detect the following faults: SAF, FF flag and RDist faults. Moreover, since the memory location 0 is read in this step, the FF flag is changed to a binary zero value. Since the r0 operation is performed on only a single memory address (assuming that the FIFO 100 has more than one memory address), then the RAM 102 is not empty and the EF flag is therefore unchanged.

Following step (5.0.a), step (5.0.b) is executed, whereupon a write operation were ones are written (hereinafter referred to as a w1 operation and shown w1 in Appendix A) is performed. The w1 operation is executed on the memory address to which the WAR 112 points at the initiation of this step (5.0.b) or based on the last step during which such pointer was positioned. Based on step (4), the WAR 112 write pointer was last positioned at the memory location 0. Therefore, the step (5.0.b) w1 operation is executed on the memory location 0. Having written to the memory location 0, the RAM 102 is full so that the FF flag is changed to the binary one value and the EF flag is unchanged.

Step (5.0.c) follows step (5.0.b). During step (5.0.c), a sequential series of operations are performed, as illustrated by the ↑ in the Operation column 2. These series of operations are r0∥DI=1 operations performed on each of the relative address count of 0 to (n−2), as illustrated by the values in the Count column and the r0∥DI=1 in the Operation column 4. Since step (5.0.a) implemented a r0 operation, the RAR 112 read pointer is positioned at the memory location 1. Step (5.0.c) is then repeated starting from the memory location 1 and for each integer between 1 and (n−2). Since r0 operations are executed in this step without any w0 operations, the FIFO is no longer full, such that the FF flag is changed to a binary zero value. In addition, since the read operation begins at the memory location 1, the entire FIFO 100 was not read, such that the EF flag is unchanged. This step (5.0.c) can detect the following faults: SAF, RDist and CF.

Next is step (5.0.d), whereupon an operation similar to the operation in step (5.0.a) is executed, except that the complementary binary values are read from the FIFO 100 and held at the DI line. More particularly, a read and verify operation of a binary one value (hereafter referred to as a r1 operation and shown r1 in Appendix A) is executed at the same time as maintaining the DI line at a binary zero value, as illustrated by the r1∥DI=0 in the Operation column 2. The operation is performed at the memory address where the RAR 114 read pointer was last positioned which, based on step (5.0.c), was the memory location 1 . Accordingly, step (5.0.d) checks to ensure that the data written in step (5.0.b) is correct and can be read when the DI line is held at the binary zero value. The FF flag is therefore unchanged because no data has been written to the RAM 102. In addition, the EF flag is changed to a binary one value because the only memory address which was not read in step (5.0.c) is read in this step (5.0.d). Like step (5.0.c), this step (5.0.d) can detect SAF, RDist and TF faults.

Following step (5.0.d) is step (5.0.e). During step (5.0.e), the same operation as step (4) is implemented in order to initialize the values in the each memory address of the RAM 102 to zeros.

While steps (1) and (2) were executed M times or based on the number of bits in the WAR 112 and RAR 114, step (5) is executed n times or based on the number of words in the RAM 102. That is, the operations for step (5) result in each step (5) (e.g., step 5.0, 5.i or 5(n−1)) being executed with both the WAR 112 and the RAR 114 initially pointing to an increasing one of the n words in the RAM 102. Accordingly, while the value of i is not be used in the operations of step (5), i indicates the relative word to which the WAR 112 and the RAR 114 address at the initiation of each step (5). During each iteration of step (5), (n+1) write operations and (n+1) read operations so that each step (5) iteration will begin at a sequentially increasing word of the RAM 102. For example, for step (5.0), the WAR 112 and the RAR 114 initially point to the memory location 0. Therefore, the operation in step (5.0.a) is performed on memory location 0. Similarly, for step (5.i) where i equals 4, for example, the WAR 112 and the RAR 114 initially point to memory location 4. Accordingly, while step (5) is shown for the boundary conditions i equal to 0 (step (5.0)) and i equal to (n−1) (step (5.(n−1)) and for the generic values of i equal to 1 to (n−2) (step 5.i), step (5) applies to executions on each successive n word in the RAM 102 rather than to executions on particular values of the M-bits of the WAR 112 and RAR 114, as is the case with steps (1) and (2).

Step (5.i) is the generic equivalent of step (5.0) as to the types of operations performed and faults identified and where, in step (5.0), i equals 0. Step (5.i) is repeated for the values of i equal to 1 to (n−2). However, step (5.i) will be implemented only where the value of (n−2) is greater than 1. The same example for implementing step (1.i) applies to implementing step (5.i).

In addition, the sub-steps (5.i.a and 5.i.e) are the generic equivalent of the sub-steps (5.0.a to 5.0.e) where, in step (5.0) the WAR 112 and RAR 114 point at the outset of such step to the memory location 0. In step (5.i), the WAR 112 and RAR 114 point at the outset of such step to the memory location i. Moreover, the same values for the FF and EF flags and for the faults identified in step (5.0) apply to the generic step (5.i).

The upper boundary condition for the generic step (5.i), for i equal to (n−1), is executed next. Step (5.(n−1)) is the same as step (5.i), where, in step (5.(n−1)) the WAR 112 and RAR 114 point at the outset of such step to the memory location (n−1). Moreover the same values for the FF and EF flags and the faults identified in step (5.0) apply to step (5.(n−1)).

After step (5), step (6) is executed. Step (6) is identical to the previously described step (3) shown in this Appendix A. Step (6) operates in the same manner to support the detection of the same faults in the algorithm as step (3).

Step (7) follows step (6). Step (7) is identical to the previously described step (4) as to successive write operations from a count of 0 to (n−1). The difference between step (7) and step (4) is that the complementary binary value is written to the RAM 102 and held on the DI line. This results in supporting the algorithm to detect faults based on such complementary binary values.

After the execution of step (7), step (8) is executed. Similarly, step (8), including steps (8.0, 8.i and 8(n−1)), is identical to the previously described step (5), including steps (5.0, 5.i and 5(n−1)), as to the order of write and read operations, holding the DI line at a constant binary value and the successive operations from counts of 0 to (n−2) and 0 to (n−1). The difference between step (8) and step (5) is that the opposite binary values are applied to and read from the RAM 102 and held on the DI line. This results in supporting the algorithm to detect faults based on such complementary binary values.

Step (9) follows the last execution of step (8). During step (9.a), a delay occurs. Following step (9.a), step (9.b) is executed n times. During each execution of step (9.b), a r1 operation followed by a w0 operation is performed in order to read whether a word of all ones is present and then write a word of all zeros to each successive memory location in the RAM 102. During step (9.b), DRFs can be manifested based on whether the binary one values previously written in step (8.(M−1).e) were retained after the delay in step (9.a). At the end of step (9.b), the FF and EF flags should be logic high and logic low, respectively. Also, the RAM 102 should be full because n words have been written. In addition, the RAM 102 is not empty since one or more unread words have been written.

Following step (9), step (10) is executed. During step (10.a), another delay occurs. Step (10.b) is then executed n times to read whether a word of all zeros is present in each successive memory location of the RAM 102. Step (10.b) can serve to manifest DRFs by detecting retention of words of all zeros. At the end of step (10.b), the FF and EF flags should be logic low and logic high, respectively. The RAM 102 is not full because one or more of the n words previously written were read. In addition, the RAM 102 is empty because each of the n words has been read.

The testing times for the steps of the method illustrated in Appendix A are as follows: step (0) runs in an amount of time equal to the sum of the running times for each operation in sub-steps (a) to (g) (i.e., constant time or an amount of time unrelated to the number of n words in the RAM 102). Steps (1) and (2) run in an amount of time proportional to $n*\log(n)$. Steps (3) and (6), like step (0), run in constant time. Steps (4) and (7) run in an amount of time proportional to n, or the number of words in the RAM 102. Steps (5) and (7) run in an amount of time proportional to $n^2$, or the square of the number of n words in the RAM 102. In addition, the delays in step (8) and (9) depend on the particular FIFO 100 technology implementation and the read and write operations of those steps (8) and (9) run in an amount of time proportional to n, or the number of words in the RAM 102. Accordingly, the overall running time for the method according to the present invention illustrated in Appendix A is an amount proportional to $n^2$, or the square of the number of n words in the RAM 102.

In addition, alternative methods according to the present invention can include fewer steps than are illustrated in Appendix A. For example, the following steps can be executed alone to detect particular faults in the FIFO 100: first, step (1); second, step (2); third, steps (3) to (8). Also, steps (1) and/or steps (9) and 10) can be added to any of the steps (1), (2) or (3) to (8), which can be executed alone. Moreover, the order of execution of the steps can be different than that illustrated in Appendix A. For example, steps (1), (2) and (3) to (8) can be executed in any order.

The foregoing describes a method of testing dual-port, RAM-Type FIFO 100s for memory, addressing and functional faults. It is to be understood that the above-described embodiments are merely illustrative of the principles of the invention. Various modifications and changes may be made thereto by those skilled in the art which will embody the principles of the invention and fall within the spirit thereof. For example, the values read or written in the steps of the method of our invention are necessary only to the extent of their complementary relationship to one another. In alternative embodiments, each of the binary values in the steps of the method may be reversed, so long as each value is reversed. In addition, the invention is not to be considered limited by the specific examples illustrated herein, but by the appended claims.

APPENDIX A

| Col. 1 Step | Col. 2 Oper. | Col. 3 Count From | Col. 3 Count To | Col. 4 Oper. | Col. 5 FF | Col. 6 EF | Col. 7 Detected Faults |
|---|---|---|---|---|---|---|---|
| *Check Basic Operations* | | | | | | | |
| 0 | a  RS | | | | 0 | 1 | |
|   | b  r0‖RE = 1 | | | | 0 | 1 | ORP, RAck |
|   | c  w0‖WE = 0 | | | | 0 | 1 | WE, WAck |
|   | d  w0 | | | | 0 | 0 | WAck |
|   | e  r0‖RE = 0 | | | | 0 | 0 | RE, RAck |
|   | f  r0 | | | | 0 | 1 | RAck |
|   | g  RT | | | | 0 | 0 | RT |
| *Check Reset Operations* | | | | | | | |
| 1.0 | a  RS | | | | 0 | 1 | |
|   | b  ↑ | 0 | 0 | w0, r0 | 0 | 1 | |
|   | c  RS | | | | 0 | 1 | |
|   | d  ↑ | 0 | n - 2 | w0 | 0 | 0 | RS, EF |
|   | e  w0 | | | | 1 | 0 | RS, FF, ADF |
|   | f  w0 | | | | 1 | 0 | RS, OWP, WAck, ADF |
| . . . | | | | | | | |
| 1.i | a  RS | | | | 0 | 1 | |
|   | b  ↑ | 0 | $2^i - 1$ | 0, r0 | 0 | 1 | |
|   | c  RS | | | | 0 | 1 | |
|   | d  ↑ | 0 | n - 2 | w0 | 0 | 0 | RS, EF |
|   | e  w0 | | | | 1 | 0 | RS, FF, ADF |
|   | f  w0 | | | | 1 | 0 | RS, OWP, WAck, ADF |
| . . . | | | | | | | |
| 1.(M-1) | a  RS | | | | 0 | 1 | |
|   | b  ↑ | 0 | $2^{M-1} - 1$ | w0, r0 | 0 | 1 | |
|   | c  RS | | | | 0 | 1 | |
|   | d  ↑ | 0 | n - 2 | w0 | 0 | 0 | RS, EF |
|   | e  w0 | | | | 1 | 0 | RS, FF, ADF |
|   | f  w0 | | | | 1 | 0 | RS, OWP, WAck, ADF |
| *Check Re-Transmit Operation* | | | | | | | |
| 2.0 | a  RS | | | | 0 | 1 | |
|   | b  ↑ | 0 | 0 | W0, r0 | 0 | 1 | |
|   | c  RT | | | | 0 | 0 | RT, EF |
|   | d  ↑ | 0 | 0 | r0 | 0 | 1 | RT |
|   | e  r0 | | | | 0 | 1 | RT, ORP, RAck |
| . . . | | | | | | | |
| 2.i | a  RS | | | | 0 | 1 | |
|   | b  ↑ | 0 | $2^i - 1$ | w0, r0 | 0 | 1 | |
|   | c  RT | | | | 0 | 0 | RT, EF |
|   | d  ↑ | 0 | $2^i - 1$ | r0 | 0 | 1 | RT |
|   | e  r0 | | | | 0 | 1 | RT, ORP, RAck |
| . . . | | | | | | | |
| 2.(M-1) | a  RS | | | | 0 | 1 | |
|   | b  ↑ | 0 | $2^{M-1} - 1$ | w0, r0 | 0 | 1 | |
|   | c  RT | | | | 0 | 0 | RT, EF |
|   | d  ↑ | 0 | $2^{M-1} - 1$ | r0 | 0 | 1 | RT |
|   | e  r0 | | | | 0 | 1 | RT, ORP, RAck |
| *Reset* | | | | | | | |
| 3 | RS | | | | 0 | 1 | |
| *Initialize to 0s* | | | | | | | |
| 4 | ↑ | 0 | n - 1 | w0 | 1 | 0 | RS, FF |
| *Check Memory Cells* | | | | | | | |
| 5.0 | a  r0‖DI = 1 | | | | 0 | 0 | SAF, FF, RDist |
|   | b  w1 | | | | 1 | 0 | |
|   | c  ↑ | 0 | n - 2 | r0‖DI = 1 | 0 | 0 | SAF, RDist, CF |
|   | d  r1‖DI = 0 | | | | 0 | 1 | SAF, RDist, RF |
|   | e  ↑ | 0 | n - 1 | w0 | 1 | 0 | |
| . . . | | | | | | | |
| 5.i | a  r0‖DI = 1 | | | | 0 | 0 | SAF, FF, RDist |
|   | b  w1 | | | | 1 | 0 | |
|   | c  ↑ | 0 | n - 2 | r0‖DI = 1 | 0 | 0 | SAF, RDist, CF |
|   | d  r1‖DI = 0 | | | | 0 | 1 | SAF, RDist, TF |
|   | e  ↑ | 0 | n - 1 | w0 | 1 | 0 | |
| . . . | | | | | | | |
| 5.(n-1) | a  r0‖DI = 1 | | | | 0 | 0 | SAF, FF, RDist |

APPENDIX A-continued

| Col. 1 Step | | Col. 2 Oper. | Col. 3 Count From | To | Col. 4 Oper. | Col. 5 FF | Col. 6 EF | Col. 7 Detected Faults |
|---|---|---|---|---|---|---|---|---|
| | b | w1 | | | | 1 | 0 | |
| | c | ↑ | 0 | n − 2 | r0‖DI = 1 | 0 | 0 | SAF, RDist, CF |
| | d | r1‖DI = 0 | | | | 0 | 1 | SAF, RDist, TF |
| | e | ↑ | 0 | n − 1 | w0 | 1 | 0 | |
| | | | | | 20/23 Reset | | | |
| 6 | | RS | | | | 0 | 1 | |
| | | | | | Initialize to 1s | | | |
| 7 | | ↑ | 0 | n − 1 | w1 | 1 | 0 | |
| | | | | | Check Memory Cells | | | |
| 8.0 | a | r1‖DI = 0 | | | | 0 | 0 | SAF, FF, RDist |
| | b | w0 | | | | 1 | 0 | |
| | c | ↑ | 0 | n − 2 | r1‖DI = 0 | 0 | 0 | SAF, RDist, CF |
| | d | r0‖DI = 1 | | | | 0 | 1 | SAF, RDist, TF |
| | e | ↑ | 0 | n − 1 | w1 | 1 | 0 | |
| ... | | | | | | | | |
| 8.i | a | r1‖DI = 0 | | | | 0 | 0 | SAF, FF, RDist |
| | b | w0 | | | | 1 | 0 | |
| | c | ↑ | 0 | n − 2 | r1‖DI = 0 | 0 | 0 | SAF, RDist, CF |
| | d | r0‖DI = 1 | | | | 0 | 1 | SAF, RDist, TF |
| | e | ↑ | 0 | n − 1 | w1 | 1 | 0 | |
| ... | | | | | | | | |
| 8.(n-1) | a | r1‖DI = 0 | | | | 0 | 0 | SAF, FF, RDist |
| | b | w0 | | | | 1 | 0 | |
| | c | ↑ | 0 | n − 2 | r1‖DI = 0 | 0 | 0 | SAF, RDist, CF |
| | d | r0‖DI = 1 | | | | 0 | 1 | SAF, RDist, TF |
| | e | ↑ | 0 | n − 1 | w1 | 1 | 0 | |
| | | | | | Check Data Retention | | | |
| 9 | a | Delay | | | | | | |
| | b | ↑ | 0 | n − 1 | r1, w0 | 1 | 0 | DRF |
| 10 | a | Delay | | | | | | |
| | b | ↑ | 0 | n − 1 | r0 | 0 | 1 | DRF |

What is claimed is:

1. A method for detecting faults in a memory-based FIFO having n words of memory, each of said n words of memory addressed by one of a plurality of addresses, a read address register for addressing one of said plurality of addresses at a time to be read from, a write address register for addressing one of said plurality of addresses at a time to be written to, and said write address register and said read address register having a bit width of M, where n and M are integers, said method comprising the steps of:

executing a check reset step a plurality of times equal to each successive integer value of i, from i equal to 0 to (M−1), said check reset step including
(a) a reset operation,
(b) a sequence of a write operation of a first binary value followed by a read operation of said first binary value executed at successive ones of said plurality of addresses to an address equal to the value of $2^i-1$,
(c) a reset operation,
(d) a write operation of said first binary value executed at successive ones of said plurality of addresses to said address equal to the value of n−2,
(e) a write operation of said first binary value, and
(f) a write operation of said first binary value.

2. The method according to claim 1 wherein executing said check reset step said plurality of times detects at least one addressing fault.

3. The method according to claim 1 wherein said first binary value is a binary one value.

4. The method of claim 1 further comprising the steps of: executing a check re-transmit step a plurality of times equal to each successive integer value of i, from i equal to 0 to (M−1), said check re-transmit step including
(a) a reset operation,
(b) a sequence of a write operation of said first binary value followed by a read operation of said first binary value executed at successive ones of said plurality of addresses to an address equal to the value of $2^i-1$,
(c) a re-transmit operation,
(d) a read operation of said first binary value executed at successive ones of said plurality of addresses to said address equal to the value of said equation $2^i-1$ and
(e) a read operation of said first binary value.

5. The method according to claim 4 wherein executing said check reset step said plurality of times detects at least one addressing fault.

6. The method according to claim 4 wherein said first binary value is a binary one value.

7. The method of claim 4 further comprising the steps of:
(I) executing a reset operation;
(II) executing a write operation of a first binary value at successive ones of said plurality of addresses to an address equal to the value of n−1,
(III) executing a check-memory-1 step a plurality of times equal to each successive integer value of i, from i equal to 0 to (n−1), said check-memory-1 step including
(a) a read operation of said first binary value while holding said data input line at a second binary value, said second binary value being the complement of said first binary value, (b) a write operation of said second binary value, (c) a read operation of said first binary value while holding said data input line at said second binary value executed at successive ones of said plurality of addresses to said address equal to the value of n−2, (d) a read operation of said second binary value while holding said data input line at said first binary value, (e) a write operation of said first binary value executed at successive ones of said plurality of addresses to said address equal to the value of n−1; and (IV) executing a reset operation;

(V) executing a write operation of said second binary value at successive ones of said plurality of addresses to said address equal to the value of n−1; and (VI) executing a check-memory-2 step a plurality of times equal to each successive integer value of i, from i equal to 0 to (n−1), said check-memory-2 step including steps (III,a) to steps (III,e) of said check-memory-1 step where said first binary value is equal to the complement of said first binary value used for said check-memory-1 step.

8. The method according to claim 7 wherein executing said check reset step said plurality of times detects at least one addressing fault.

9. The method according to claim 7 wherein for step (III), said first binary value is a binary one value and said second binary value is a binary one value, and for step (VI), said first binary value is a binary zero value and said second binary value is a binary one value.

10. The method of claim 7, wherein said FIFO enables a read operation by applying said first binary value to a read enable signal and disables said read operation by applying said second binary value to said read enable signal, and said FIFO and disables said write operation by applying said second binary value to a write enable signal, said method further comprising the steps of:

(a) executing a reset operation;

(b) executing a read operation of said first binary signal with said read enable signal held at an active binary signal;

(c) executing a write operation of said first binary signal with said write enable signal held at an inactive binary signal;

(d) executing a write operation of said first binary value;

(e) executing a read operation of said first binary signal with said read enable signal held at said inactive binary signal;

(f) executing a read operation of said first binary value; and (g) executing a re-transmit operation.

11. The method of claim 7 wherein upon completion of said check-memory-2step, said method further comprising the steps of:

(a) executing a delay;

(b) executing a sequence of a read operation of said second binary value followed by a write operation of said first binary value at successive ones of said plurality of addresses from said address to which said write address register and said read address register point upon completion of said check-memory-2 step to said address equal to the value of n−1;

(c) executing a delay; and (d) executing a read operation of said first binary value at successive ones of said plurality of addresses to said address equal to the value of n−1.

12. The method of claim 1 further comprising the steps of:

(I) executing a reset operation;

(II) executing a write operation of a first binary value at successive ones of said plurality of addresses to an address equal to the value of n−1, (III) executing a check-memory-1 step a plurality of times equal to each successive integer value of i, from i equal to 0 to (n−1), said check-memory-1 step including (a) a read operation of said first binary value while holding said data input line at a second binary value, said second binary value being the complement of said first binary value, (b) a write operation of said second binary value, (c) a read operation of said first binary value while holding said data input line at said second binary value executed at successive ones of said plurality of addresses to said address equal to the value of n−2, (d) a read operation of said second binary value while holding said data input line at said first binary value, (e) a write operation of said first binary value executed at successive ones of said plurality of addresses to said address equal to the value of n−1; and (IV) executing a reset operation;

(V) executing a write operation of said second binary value at successive ones of said plurality of addresses to said address equal to the value of n−1; and (VI) executing a check-memory-2 step a plurality of times equal to each successive integer value of i, from i equal to 0 to (n−1), said check-memory-2 step including steps (III,a) to steps (III,e) of said check-memory-1 step where said first binary value is equal to the complement of said first binary value used for said check-memory-1 step.

13. The method according to claim 12 wherein executing said check reset step said plurality of times detects at least one addressing fault.

14. The method according to claim 12 wherein for step (III), said first binary value is a binary zero value and said second binary value is a binary one value, and for step (VI), said first binary value is a binary one value and said second binary value is a binary zero value.

15. A method for detecting faults in a memory-based FIFO having n words of memory, each of said n words of memory addressed by one of a plurality of addresses, a read address register for addressing one of said plurality of addresses at a time to be read from, a write address register for addressing one of said plurality of addresses at a time to be written to, and said write address register and said read address register having a bit width of M, where n and M are integers, said method comprising the steps of:

executing a check re-transmit step a plurality of times equal to each successive integer value of i, from i equal to 0 to (M−1), said check re-transmit step including (a) a reset operation, (b) a sequence of a write operation of a first binary value followed by a read operation of said first binary value executed at successive ones of said plurality of addresses to an address equal to the value of $2^i-1$, (c) a re-transmit operation, (d) a read operation of said first binary value executed at successive ones of said plurality of addresses to said address equal to the value of said equation $2^i-1$ and (e) a read operation of said first binary value.

16. The method according to claim 15 wherein said first binary value is a binary one value.

17. The method of claim 15 further comprising the steps of:
(I) executing a reset operation;
(II) executing a write operation of a first binary value at successive ones of said plurality of addresses to an address equal to the value of n−1,
(III) executing a check-memory-1 step a plurality of times equal to each successive integer value of i, from i equal to 0 to (n−1), said check-memory-1 step including
   (a) a read operation of said first binary value while holding said data input line at a second binary value, said second binary value being the complement of said first binary value,
   (b) a write operation of said second binary value,
   (c) a read operation of said first binary value while holding said data input line at said second binary value executed at successive ones of said plurality of addresses to said address equal to the value of n−2,
   (d) a read operation of said second binary value while holding said data input line at said first binary value,
   (e) a write operation of said first binary value executed at successive ones of said plurality of addresses to said address equal to the value of n−1; and
(IV) executing a reset operation;
(V) executing a write operation of said second binary value at successive ones of said plurality of addresses to said address equal to the value of n−1; and
(VI) executing a check-memory-2 step a plurality of times equal to each successive integer value of i, from i equal to 0 to (n−1), said check-memory-2 step including steps (III,a) to steps (III,e) of said check-memory-1 step where said first binary value is equal to the complement of said first binary value used for said check-memory-1 step.

18. A method for detecting faults in a memory-based FIFO having n words of memory, each of said n words of memory addressed by one of a plurality of addresses, a read address register for addressing one of said plurality of addresses at a time to be read from, a write address register for addressing one of said plurality of addresses at a time to be written to, a data input line for providing data to said n words and said write address register and said read address register having a bit width of M, where n and M are integers, said method comprising the steps of:
(I) executing a reset operation;
(II) executing a write operation of a first binary value at successive ones of said plurality of addresses to an address equal to the value of n−1,
(III) executing a check-memory-1 step a plurality of times equal to each successive integer value of i, from i equal to 0 to (n−1), said check-memory-1 step including
   (a) a read operation of said first binary value while holding said data input line at a second binary value, said second binary value being the complement of said first binary value,
   (b) a write operation of said second binary value,
   (c) a read operation of said first binary value while holding said data input line at said second binary value executed at successive ones of said plurality of addresses to said address equal to the value of n−2,
   (d) a read operation of said second binary value while holding said data input line at said first binary value,
   (e) a write operation of said first binary value executed at successive ones of said plurality of addresses to said address equal to the value of n−1; and
(IV) executing a reset operation;
(V) executing a write operation of said second binary value at successive ones of said plurality of addresses to said address equal to the value of n−1; and
(VI) executing a check-memory-2 step a plurality of times equal to each successive integer value of i, from i equal to 0 to (n−1), said check-memory-2 step including steps (III,a) to steps (III,e) of said check-memory-1 step where said first binary value is equal to the complement of said first binary value used for said check-memory-1 step.

19. The method according to claim 18 wherein for step (III), said first binary value is a binary zero value and said second binary value is a binary one value, and for step (VI), said first binary value is a binary one value and said second binary value is a binary zero value.

20. The method of claim 18 wherein upon completion of said check-memory-2 step, said method further comprising the steps of:
(a) executing a delay;
(b) executing a sequence of a read operation of said second binary value followed by a write operation of said first binary value at successive ones of said plurality of addresses from said address to which said write address register and said read address register point upon completion of said check-memory-2 step to said address equal to the value of n−1;
(c) executing a delay; and
(d) executing a read operation of said first binary value at successive ones of said plurality of addresses to said address equal to the value of n−1.

21. An apparatus for detecting faults in a memory-based FIFO having n words of memory, each of said n words of memory addressed by one of a plurality of addresses, a read address register for addressing one of said plurality of addresses at a time to be read from, a write address register for addressing one of said plurality of addresses at a time to be written to, and said write address register and said read address register having a bit width of M, where n and M are integers, comprising:
means for executing a check reset step a plurality of times equal to each successive integer value of i, from i equal to 0 to (M−1), said check reset step including
   (a) a reset operation,
   (b) a sequence of a write operation of a first binary value followed by a read operation of said first binary value executed at successive ones of said plurality of addresses to an address equal to the value of $2^i-1$,
   (c) a reset operation,
   (d) a write operation of said first binary value executed at successive ones of said plurality of addresses to said address equal to the value of n−2,
   (e) a write operation of said first binary value, and
   (f) a write operation of said first binary value.

22. The apparatus of claim 21 wherein said means for executing said check reset step said plurality of times enables the detection of at least one addressing fault.

23. The apparatus of claim 21 further comprising:
means for executing a check re-transmit step a plurality of times equal to each successive integer value of i, from i equal to 0 to (M−1), said check re-transmit step including
   (a) a reset operation,
   (b) a sequence of a write operation of said first binary value followed by a read operation of said first binary value executed at successive ones of said plurality of addresses to an address equal to the value of $2^i-1$, (c) a re-transmit operation, (d) a read operation of said first binary value executed at successive ones of said plurality of addresses to said address equal to the value of said equation $2^i-1$ and (e) a read operation of said first binary value.

24. The apparatus according to claim 23 wherein said first binary value is a binary one value.

25. The apparatus of claim 23 further comprising:

(I) means for executing a reset operation;

(II) means for executing a write operation of a first binary value at successive ones of said plurality of addresses to an address equal to the value of n−1, (III) means for executing a check-memory-1 step a plurality of times equal to each successive integer value of i, from i equal to 0 to (n−1), said check-memory-1 step including (a) a read operation of said first binary value while holding said data input line at a second binary value, said second binary value being the complement of said first binary value, (b) a write operation of said second binary value, (c) a read operation of said first binary value while holding said data input line at said second binary value executed at successive ones of said plurality of addresses to said address equal to the value of n−2, (d) a read operation of said second binary value while holding said data input line at said first binary value, (e) a write operation of said first binary value executed at successive ones of said plurality of addresses to said address equal to the value of n−1; and (IV) means for executing a reset operation;

(V) means for executing a write operation of said second binary value at successive ones of said plurality of addresses to said address equal to the value of n−1; and (VI) means for executing a check-memory-2 step a plurality of times equal to each successive integer value of i, from i equal to 0 to (n−1), said check-memory-2 step including steps (III.a) to steps (III.e) of said check-memory-1 step where said first binary value is equal to the complement of said first binary value used for said check-memory-1 step.

26. The apparatus of claim 25 wherein said means for executing said check reset step said plurality of times enables the detection of at least one addressing fault.

27. The apparatus according to claim 25 wherein for step (III), said first binary value is a binary one value and said second binary value is a binary zero value, and for step (VI), said first binary value is a binary zero value and said second binary value is a binary one value.

28. An apparatus for detecting faults in a memory-based FIFO having n words of memory, each of said n words of memory addressed by one of a plurality of addresses, a read address register for addressing one of said plurality of addresses at a time to be read from, a write address register for addressing one of said plurality of addresses at a time to be written to, a data input line for providing data to said n words and said write address register and said read address register having a bit width of M, where n and M are integers, comprising:

(I) means for executing a reset operation;

(II) means for executing a write operation of a first binary value at successive ones of said plurality of addresses to an address equal to the value of n−1, (III) means for executing a check-memory-1 step a plurality of times equal to each successive integer value of i, from i equal to 0 to (n−1), said check-memory-1 step including (a) a read operation of said first binary value while holding said data input line at a second binary value, said second binary value being the complement of said first binary value, (b) a write operation of said second binary value, (c) a read operation of said first binary value while holding said data input line at said second binary value executed at successive ones of said plurality of addresses to said address equal to the value of n−2, (d) a read operation of said second binary value while holding said data input line at said first binary value, (e) a write operation of said first binary value executed at successive ones of said plurality of addresses to said address equal to the value of n−1; and (IV) means for executing a reset operation;

(V) means for executing a write operation of said second binary value at successive ones of said plurality of addresses to said address equal to the value of n−1; and (VI) means for executing a check-memory-2 step a plurality of times equal to each successive integer value of i, from i equal to 0 to (n−1), said check-memory-2 step including steps (III.a) to steps (III.e) of said check-memory-1 step where said first binary value is equal to the complement of said first binary value used for said check-memory-1 step.

* * * * *